United States Patent [19]

Tepolt

[11] Patent Number: 5,746,565
[45] Date of Patent: May 5, 1998

[54] ROBOTIC WAFER HANDLER

[75] Inventor: Gary B. Tepolt, North Pelham, N.H.

[73] Assignee: Integrated Solutions, Inc., Tewksbury, Mass.

[21] Appl. No.: 589,554

[22] Filed: Jan. 22, 1996

[51] Int. Cl.⁶ ............................................... B25J 9/06
[52] U.S. Cl. .................. 414/744.5; 414/935; 901/15; 901/21; 74/490.04
[58] Field of Search .......................... 414/744.5, 917, 414/937, 938, 935; 901/21, 15; 74/490.01, 490.03, 490.04, 490.05

[56] References Cited

U.S. PATENT DOCUMENTS

| 4,433,951 | 2/1984 | Koch | 414/744.5 X |
|---|---|---|---|
| 4,552,505 | 11/1985 | Gorman | 901/21 X |
| 4,553,069 | 11/1985 | Purser | 315/111.81 |
| 4,584,045 | 4/1986 | Richards | 414/744.5 X |
| 4,643,627 | 2/1987 | Bednorz et al. | 414/217 |
| 4,654,106 | 3/1987 | Davis et al. | 156/345 |
| 4,657,618 | 4/1987 | Spencer et al. | 156/345 |
| 4,657,620 | 4/1987 | Davis et al. | 156/345 |
| 4,659,413 | 4/1987 | Davis et al. | 156/345 |
| 4,687,542 | 8/1987 | Davis et al. | 156/643 |
| 4,694,776 | 9/1987 | Sandbach et al. | 118/500 |
| 4,705,951 | 11/1987 | Layman et al. | 250/442.1 |
| 4,715,921 | 12/1987 | Maher et al. | 156/345 |
| 4,717,461 | 1/1988 | Strahl et al. | 204/192.1 |
| 4,724,621 | 2/1988 | Hobson et al. | 34/218 |
| 4,764,076 | 8/1988 | Layman et al. | 414/217 |
| 4,770,590 | 9/1988 | Hugues et al. | 414/172 |
| 4,778,331 | 10/1988 | Kimata et al. | 414/661 |
| 4,789,294 | 12/1988 | Sato et al. | 414/416 |
| 4,816,116 | 3/1989 | Davis et al. | 156/643 |
| 4,827,954 | 5/1989 | Layton | 134/76 |
| 4,842,680 | 6/1989 | Davis et al. | 156/643 |
| 4,909,701 | 3/1990 | Hardegen et al. | 414/749 |
| 4,917,556 | 4/1990 | Stark et al. | 414/217 |
| 4,923,054 | 5/1990 | Ohtani et al. | 187/25 |
| 4,966,519 | 10/1990 | Davis et al. | 414/786 |
| 5,013,385 | 5/1991 | Maher et al. | 156/345 |
| 5,015,177 | 5/1991 | Iwata | 432/121 |
| 5,020,475 | 6/1991 | Crabb et al. | 118/719 |
| 5,044,752 | 9/1991 | Thurfjell et al. | 356/400 |
| 5,044,871 | 9/1991 | Davis et al. | 414/786 |
| 5,046,992 | 9/1991 | Tamai et al. | 474/84 |
| 5,049,029 | 9/1991 | Mitsui et al. | 414/744.5 |
| 5,064,340 | 11/1991 | Genov et al. | 414/744.5 |
| 5,083,896 | 1/1992 | Uehara et al. | 414/744.5 |
| 5,092,728 | 3/1992 | Crabb et al. | 414/217 |
| 5,096,364 | 3/1992 | Messer et al. | 414/744.5 |
| 5,102,495 | 4/1992 | Maher et al. | 156/643 |
| 5,123,804 | 6/1992 | Ishii et al. | 414/680 |
| 5,156,521 | 10/1992 | Crabb et al. | 414/786 |
| 5,178,512 | 1/1993 | Skrobak | 414/744.5 |
| 5,236,295 | 8/1993 | Ishii et al. | 414/222 |
| 5,248,886 | 9/1993 | Asakawa et al. | 250/442.11 |
| 5,253,663 | 10/1993 | Tanaka et al. | 134/95.2 |
| 5,258,047 | 11/1993 | Tokisue et al. | 29/25.01 |
| 5,277,579 | 1/1994 | Takanabe | 432/5 |
| 5,288,333 | 2/1994 | Tanaka et al. | 134/31 |
| 5,324,155 | 6/1994 | Goodwin et al. | 414/744.5 X |
| 5,513,946 | 5/1996 | Sawada et al. | 414/744.5 |

OTHER PUBLICATIONS

IBM Technical Disclosure Bulletin vol. 32 No. 3A dated Aug. 1989, pp. 443–445.
G.S. Mathad, Review Wafer Reactor Technolody for Device Processing, Solid State Technology dated Apr. 1985, pp. 221–225.

Primary Examiner—Donald W. Underwood
Attorney, Agent, or Firm—Weingarten, Schurgin, Gagnebin & Hayes LLP

[57] ABSTRACT

A robotic wafer handler has first and second arms pivotally connected at a swing point to operate in a plane. Each arm is independently drivable through greater than 360° of rotation in the plane. The wafer handler may also include mechanisms for adjusting the plane of rotation, i.e., for providing lift and tilt.

20 Claims, 8 Drawing Sheets

ROBOTIC WAFER HANDLER

FIELD OF THE INVENTION

The present invention relates to a remote manipulator, and more particularly to a robotic device for manipulating semiconductor wafers.

BACKGROUND OF THE INVENTION

Some techniques for semiconductor fabrication require that wafers be individually transported from point to point. Automated transport devices for semiconductor wafers are known. For example, one type of transport device utilizes an articulated arm having an end effector like a spatula for scooping up a single wafer. The articulated arm collects the wafer from a first location, such as a queuing station, and deposits it at a second location, such as a processing chamber. The motion of the arm can be programmed to move wafers to and from various predetermined points under the direction of a computer control system. Other wafer transport devices offer variations on this theme.

Known wafer transporting devices are capable of collecting and depositing wafers at many points within their range. However, such devices may have a range of motion which is limited to two dimensions, or have pick-up and drop-off capability within only two or three specific planes in three dimensions. Further, such transport devices are limited in the number of possible paths between positions. These operational limitations become problematic when wafer collection and deposit are required to be carried out in different planes, and particularly in different planes which are not orthogonal. Such transporting devices are therefore unsuitable for use when complex wafer manipulation is required, or when the presence of other equipment limits possible motion paths.

SUMMARY OF THE INVENTION

In accordance with the present invention, a robotic wafer handler includes first and second arm portions which are independently rotatable through multiple revolutions greater than 360° of rotation. The first and second arm portions rotate in a plane which may be adjusted relative to the robotic wafer handler by lift and tilt mechanisms. A mechanism for lateral linear movement along an axis orthogonal to lift axis movement may also be employed.

The independently rotatable arm portions offer improved wafer manipulation capability in comparison to two-dimensional and limited plane of operation systems. Because the arm portions are independently rotatable, wafer collection and deposit can be carried out from a variety of possible angles of approach. Also, when used in combination with lateral, lift and tilt movement capabilities, the wafer manipulator is capable of operation in particularly confined spaces.

The second arm portion includes an end effector for handling silicon wafers, and includes an advantageous laminated structure. First and second rigid outer layers are formed from a material such as sheet aluminum or ceramic sheet. An inner layer with adhesive surfaces is formed, typically made of low cost die cut stamps, to define one or more channels which may act as conduits in the finished arm portion. The inner layer, typically a double coated foam tape, is sandwiched between the rigid outer layers, and provides vacuum and exhaust capabilities for handling wafers without the requirement of complex grooves or channels to be machined into any portion of the end effector.

BRIEF DESCRIPTION OF THE DRAWINGS

These and further features of the invention will be better understood with reference to the accompanying specification and the drawings in which.

DETAILED DESCRIPTION OF THE INVENTION

Figure 1:
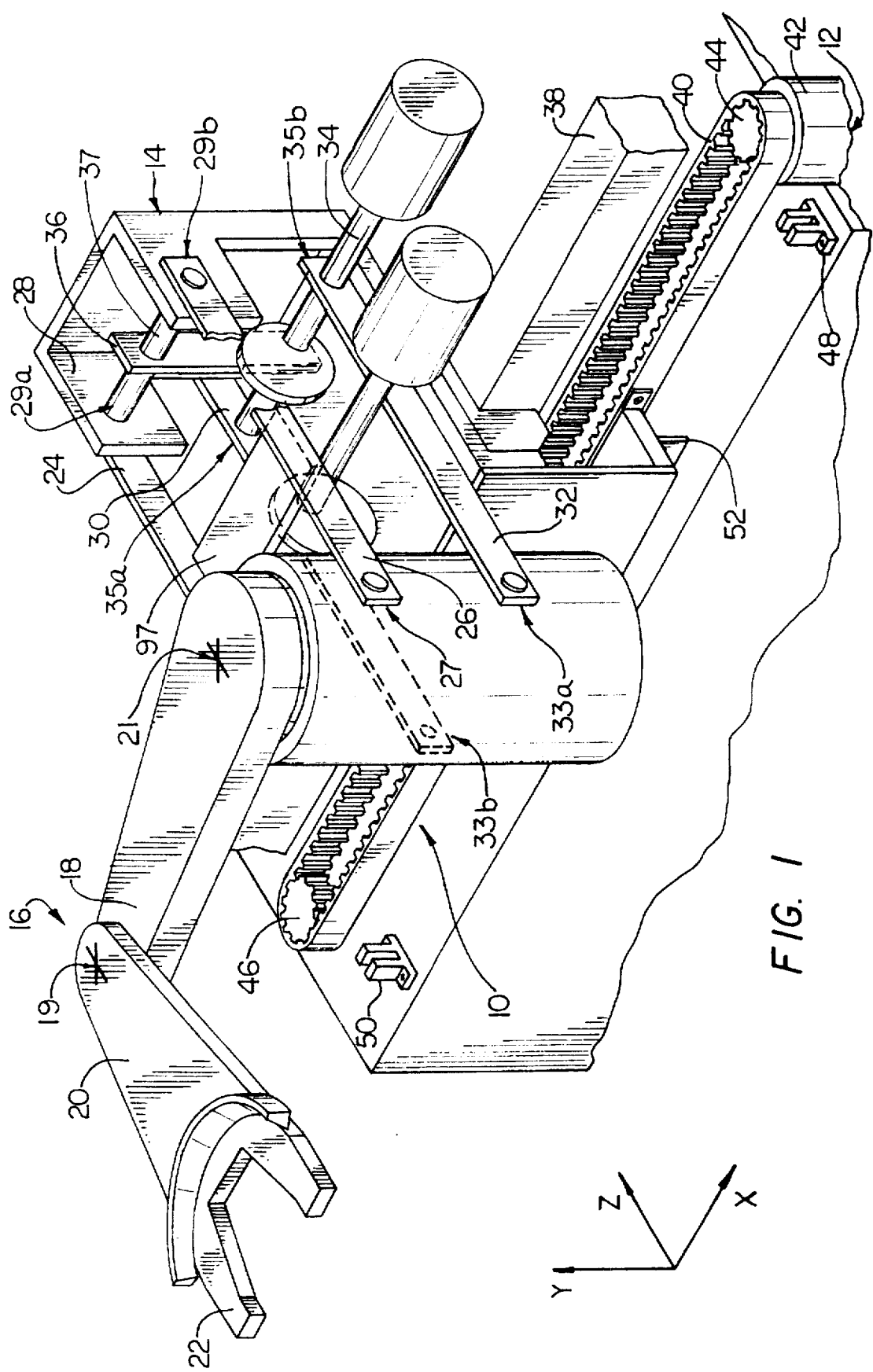
FIG. 1 is a perspective view of an embodiment of a robotic handler.

FIG. 1 is a perspective view of an embodiment of a robotic handler adapted for moving objects through a wide variety of programmable coordinated motions including S-curve, parabolic, and trapezoidal profiles. The handler is shown with respect to an X-Y-Z coordinate system, and includes a rotary motion assembly 10, a linear motion assembly 12, and a lift/tilt assembly 14.

The rotary motion assembly 10 includes a rotary arm 16 having a first arm portion 18 pivotally engaged at a swing point 19 with a second arm portion 20. The first arm portion rotates around a center point 21, and the second arm portion rotates around the swing point. The first arm portion is about five inches long and the second arm portion is about six inches long. An end effector 22 onto which a substrate, such as a silicon wafer, can be positioned is provided at a distal end of the second arm portion 20.

The rotary motion assembly 10 provides improved rotational capability for moving the end effector 22, i.e., more than a basic 360° rotation. Each arm is independently rotatable in a plane (the X-Z plane as illustrated) through multiple revolutions, without limit. The improved rotational capability of each arm portion provides exceptional flexibility when programming paths of motion to collect and deposit wafers in a confined work area. In particular, the rotary motion assembly allows wafer collection and deposit from a wide variety of possible angles.

The rotary motion assembly 10 is movably engaged with the lift/tilt assembly 14. In the illustrated embodiment, first and second linkages 24 and 26, respectively, are pivotally engaged with the rotary motion assembly 10 at a first end 27 (illustrated on second linkage only) of each linkage, and are pivotally engaged with a mount 28 at a second end 29a, 29b of the first and second linkages, respectively. Third and fourth linkages 30 and 32 are pivotally engaged with the rotary motion assembly 10 at a first end 33a, 33b of the third and fourth linkages, respectively, and are pivotally engaged with a shaft 34 at a second end 35a, 35b. The shaft 34 is suspended by a link 36 which is pivotally connected to the mount 28 by a pin 37. Thus, linkages 30 and 32 can move longitudinally with respect to linkages 24 and 26 to cause or allow the rotary motion assembly 10 to be lifted and/or tilted. Such lifting and tilting allow adjustment of the plane of rotation of the arms 16, 20.

The mount 28 is engagable with the linear motion assembly 12 that moves the mount, the rotary motion assembly 10, and the lift/tilt assembly 14 linearly along the X-axis. The mount 28 is positioned on a guide or track 38, such as a linear ball slide, and is engaged with a belt 40 driven by a motor 42 such as the CMC Torque Systems model ME2120. The motor 42 is coupled to a cog pulley 44 that engages notches on the belt 40 to prevent belt slippage and ensure precise control of linear movement. The belt is constructed of polyurethane with polyester cord for low stretch. A second cog pulley 46 is located at the opposite end of linear motion assembly 12 to limit linear travel of the mount 28. Additional limit sensors 48 and 50, such as photo microsensors, can be provided for detecting the presence of a trip 52 which is secured to the mount 28. Linear travel range in the X-axis is about 9 inches in this implementation, though X-axis range can be practically extended to 36 inches or more.

Figure 2:
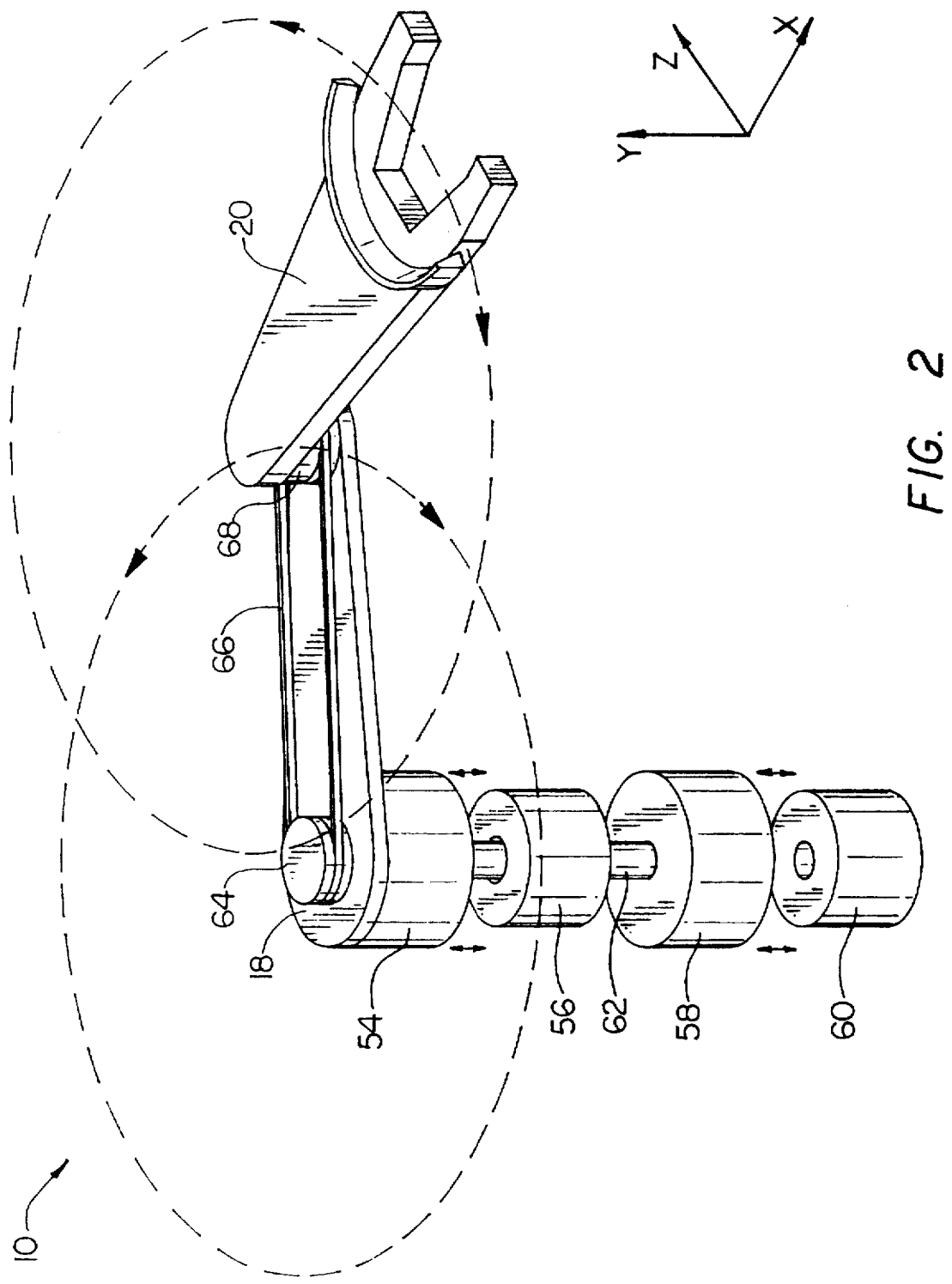
FIG. 2 is an exploded view of the rotary motion assembly for the robotic handler of FIG. 1.

FIG. 2 is an exploded view of an embodiment of the rotary motion assembly 10. A first direct drive motor 54 is coupled with the first arm portion 18 and a first modular position encoder 56 for digital position control. A second motor 58 is direct coupled to a second modular position encoder 60. A shaft 62 passing through the first encoder 56 and the first motor 54 is connected to a first pulley 64 which is rotated by the second motor 58. The shaft may be hollow in structure, with rotary seals for functioning as a conduit. This concentric motor-shaft-drive configuration eliminates bending of motor drive and encoder wires and tubes, which would greatly increase potential for fatigue failure.

A flexible belt 66 connects the first pulley 64 to a second pulley 68 that is secured to the second arm portion 20 and rotatably engaged with the first arm portion 18. Rotation of the first pulley 64 causes the second pulley 68 to rotate, thereby rotating the second arm portion 20 with respect to the first arm portion 18. As shown by the dotted lines, each of the arm portions is independently rotatable through 360 degrees in both clockwise and counter-clockwise directions. Although the first arm portion is slightly offset from the second arm portion, both arm portions rotate in substantially the same plane. Housings may be provided to conceal and protect the motors, encoders, shaft, pulleys, and belt.

Figure 3:
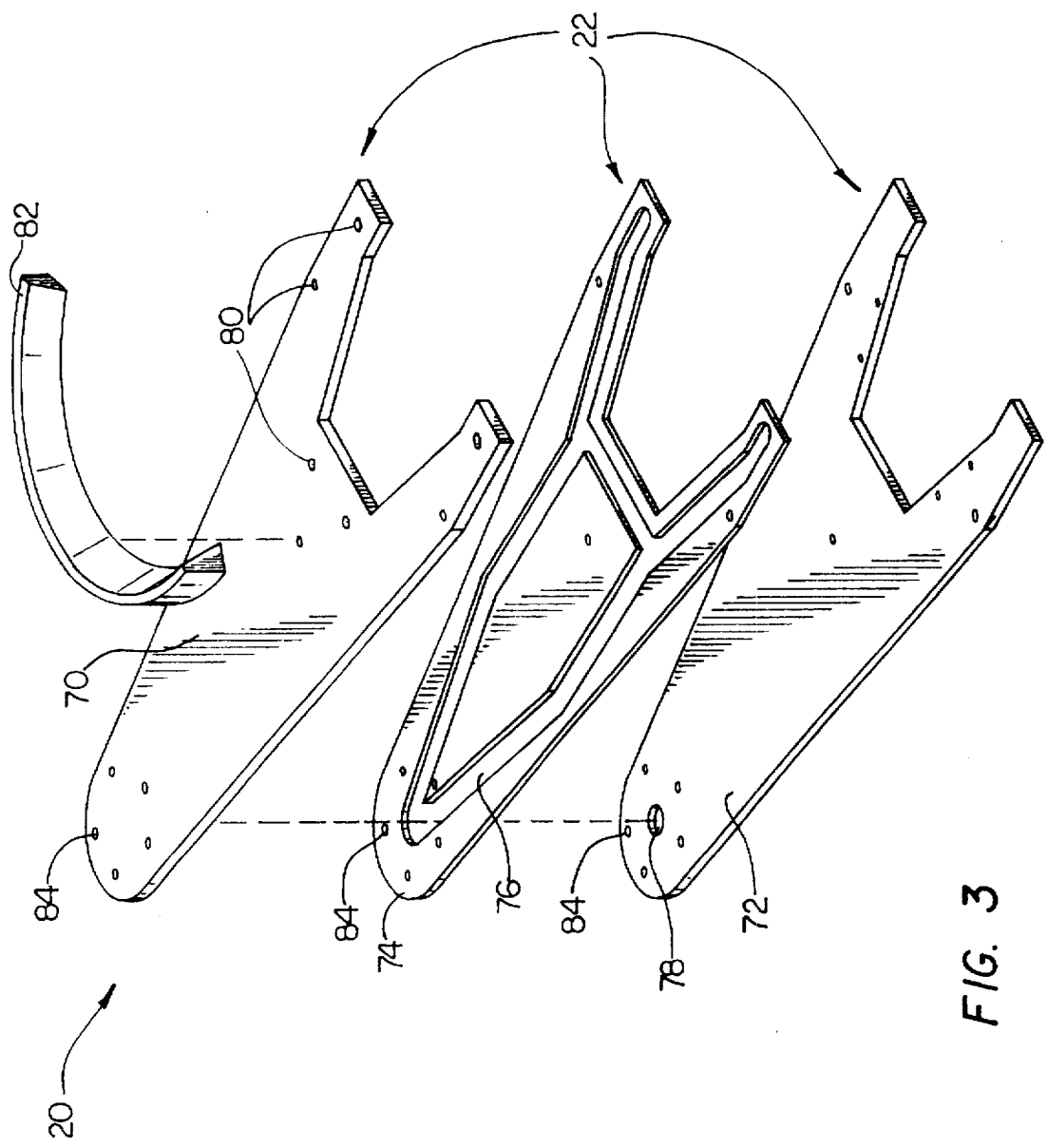
FIG. 3 is an exploded view of the end effector of FIG. 1.

FIG. 3 is an exploded view of an exemplary second arm portion 20 and end effector 22 for the rotary arm. The second arm portion includes first and second rigid outer layers 70, 72 cut to a desired shape from sheet aluminum or other rigid material. An inner layer 74 with adhesive surfaces includes cut-out portions that define one or more channels 76 when the inner layer is sandwiched between the outer layers 70 and 72. Both inner and outer layers have relatively little mass. When assembled, the two outer layers 70 and 72 provide rigidity and identical thermal expansion characteristics, while the middle adhesive layer 74, typically 0.02 to 0.05 inches thick, functions as a conduit for liquid or gaseous materials. Thus, the laminated end effector 22 is a low-inertia structure that allows a vacuum to be provided for holding wafers without requiring complex grooves or channels to be machined into any portion of the end-effector.

A hole 78 in the outer layer 72 leads from the channels 76 in the second arm portion 20 through a conduit in the second pulley 68 (FIG. 2) to a passage in the first arm portion 18 (FIG. 2) which can have a laminated structure similar to that shown for the second arm portion 20. The passage in the first arm portion can be in communication with a vacuum source via the hollow shaft 62 (FIG. 2) or a separate conduit.

The outer layer 70 of the second arm portion 20 includes a number of holes 80 through which gas may be exhausted, or a vacuum applied as described above. A banker 82 is secured to the outer layer to assist in positioning a wafer on the end effector 22. Screw holes 84 allow for attachment of the second arm portion to the second pulley 68 (FIG. 2) with screws.

Figure 4:
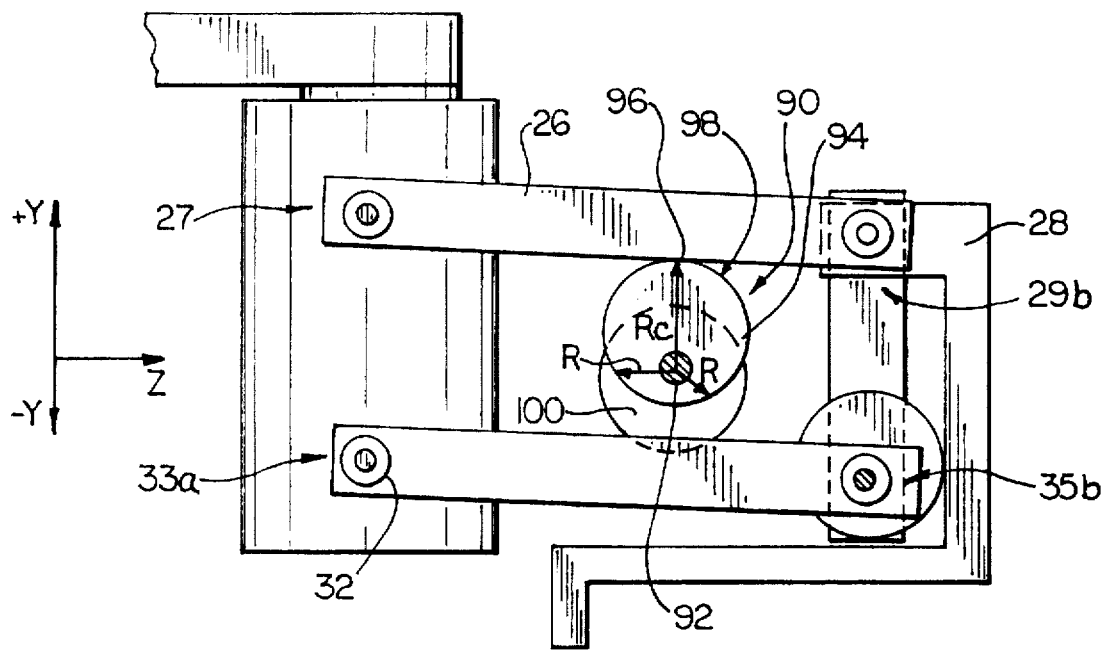
FIGS. 4 & 5 are side views of the robotic handler of FIG. 1 which illustrate lift motions.

FIG. 4 is a side view of a portion of the robotic handler illustrating Y-axis movement. A first eccentric drive mechanism 90 is employed to move the rotary arm assembly along the Y-axis. The mechanism includes a shaft 92 and a cam 94. The shaft is situated lengthwise in the X-axis (See FIG. 1), and is connected to the cam to provide a varying shaft to cam edge radius R. The cam has an edge 96 which contacts and supports a crossbar 97 (FIG. 1) connected between linkages 24, 26 against gravitational force. The second linkage 26 is pivotally connected to the mount 28 and the rotary arm assembly at opposing ends 27, 29b, respectively, relative to the cam. The shaft 92 is connected to a motor which operates to rotate the shaft. The rotary arm assembly thus moves in the Y-axis as the shaft 92 rotates the cam 94. More particularly, the cam radius R varies from a maximum to a minimum value, and Y-axis motion is controlled by rotating the cam to a contact point radius $R_c$, corresponding to a desired Y-axis position.

The cam includes an outer ball bearing tire 98 to reduce friction. Reduced friction allows improved assembly longevity and accuracy. Y-Axis movement in this embodiment is servo controlled and as such is position and speed programmable. The range of Y-Axis motion is 0.0 to +0.8 Inches, with accuracy and repeatability on the order of ±0.001 inch.

The Y-Axis position sensor may be an encoder attached to the Y- motion drive motor. A first optical flag is used to originate or zero the position, and a second optical flag signal is used to identify the over center "up" Y position. The computer control card counts the motor encoder pulses from Y start position to Y "up" position upon power-up, and then uses the encoder pulses as servo signals for the motion control during any Y-axis move.

Figure 5:
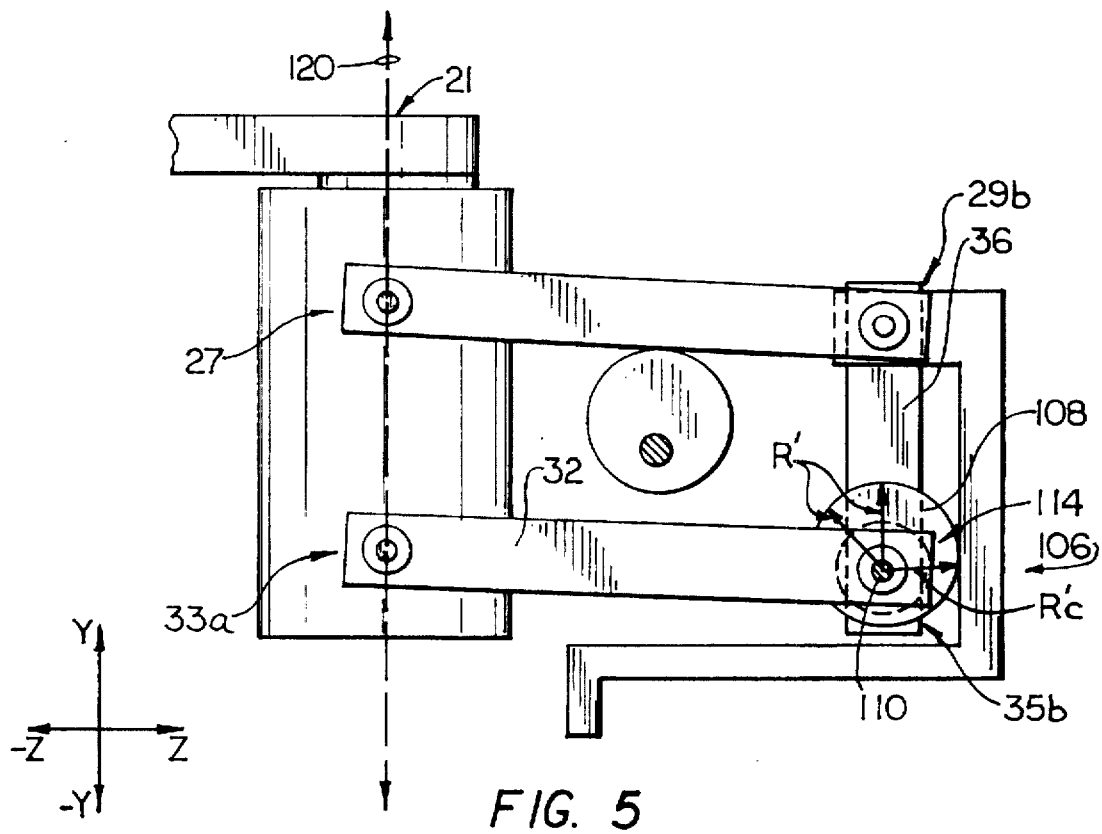

Turning now to FIG. 5, a second eccentric drive 106 is employed to provide rotary arm assembly movement along the Z-axis. The second eccentric drive includes a cam 108 and a shaft 110, and is pivotally connected to both the fourth linkage 32 and the link 36. More particularly, the link is pivotally connected to the mount at the second end 29b, and to the shaft and fourth linkage at a second end 35b. The fourth linkage 32 is pivotally connected to the rotary arm assembly at the first end 33a. The shaft is connected to a motor, which operates to rotate the shaft. The cam contacts the mount so that the second eccentric drive supports linkages 35a, 35b against gravitational force. The rotary arm assembly (at first end 33a) thus moves in the Z-axis as the shaft rotates the cam. More particularly, the cam has a radius R' which is variable from a maximum to a minimum value, and Z-axis motion is controlled by rotating the cam to a contact point radius $R_c$, corresponding to a desired Z-axis position.

The Tip - Axis position sensor 114 may be an encoder attached to the Tip-motion drive motor. A first optical flag is used is used to originate to start (Horizontal) position, and a second optical flag signal is used to identify the full 20° tip position. The computer control card counts the motor encoder pulses from tip start position to tip 20° position on power-up, and then uses the encoder pulses as servo signals for the motion control during any Tip-axis move.

By using both the first and second eccentric drive mechanisms it is possible to place the rotary arm assembly in any of a variety of positions in the Y-Z plane. Such placement can be shown relative to an orientation axis 120 passing through the center point 21. The orientation axis is shown parallel to the Y-axis in FIGS. 4 & 5. By operating the first eccentric drive mechanism the rotary arm assembly can be moved up and down (lifted) along the Y-axis while maintaining the orientation axis parallel to the Y-axis. By operating the second eccentric drive mechanism the rotary arm can be tilted through a 20° range in the Y-Z plane such that the orientation axis is not parallel with the Y-axis. By operating the first and second eccentric drive mechanisms in cooperative fashion, simultaneous lifting and tilting is also possible.

Figure 6:
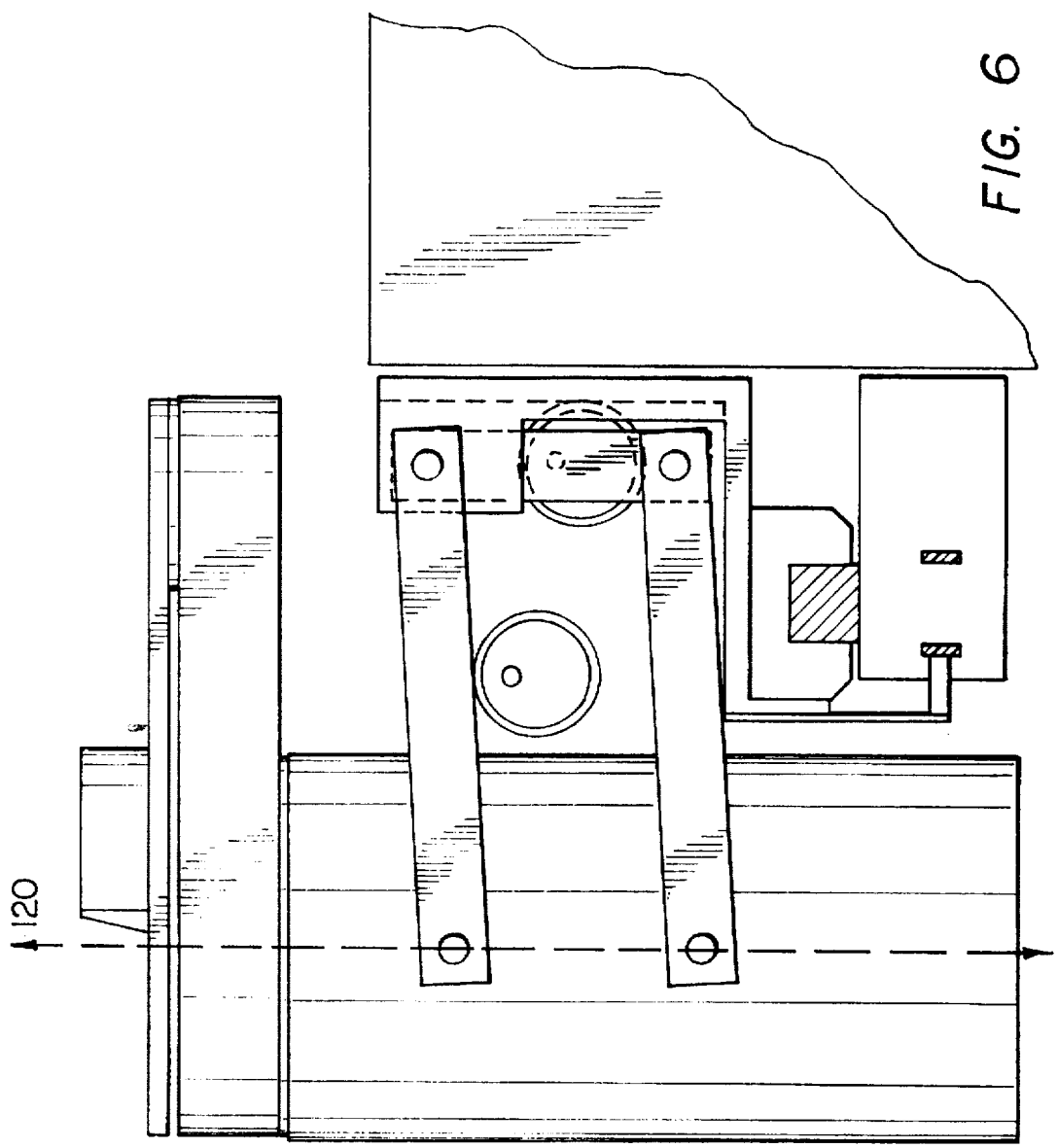
FIGS. 6–8 are side views of the robotic handler of FIG. 1 which illustrate lift and tilt motions.
Figure 7:
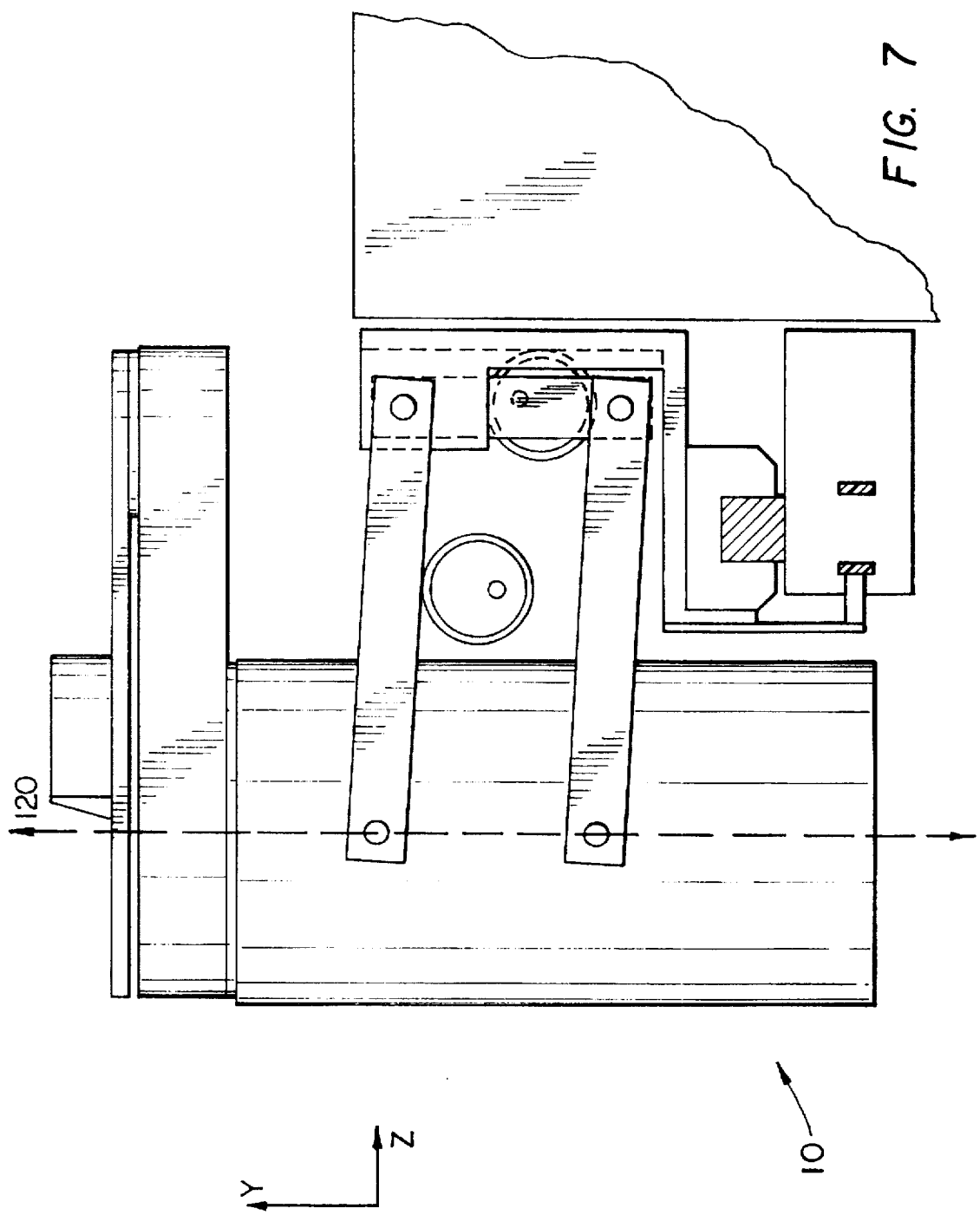
Figure 8:
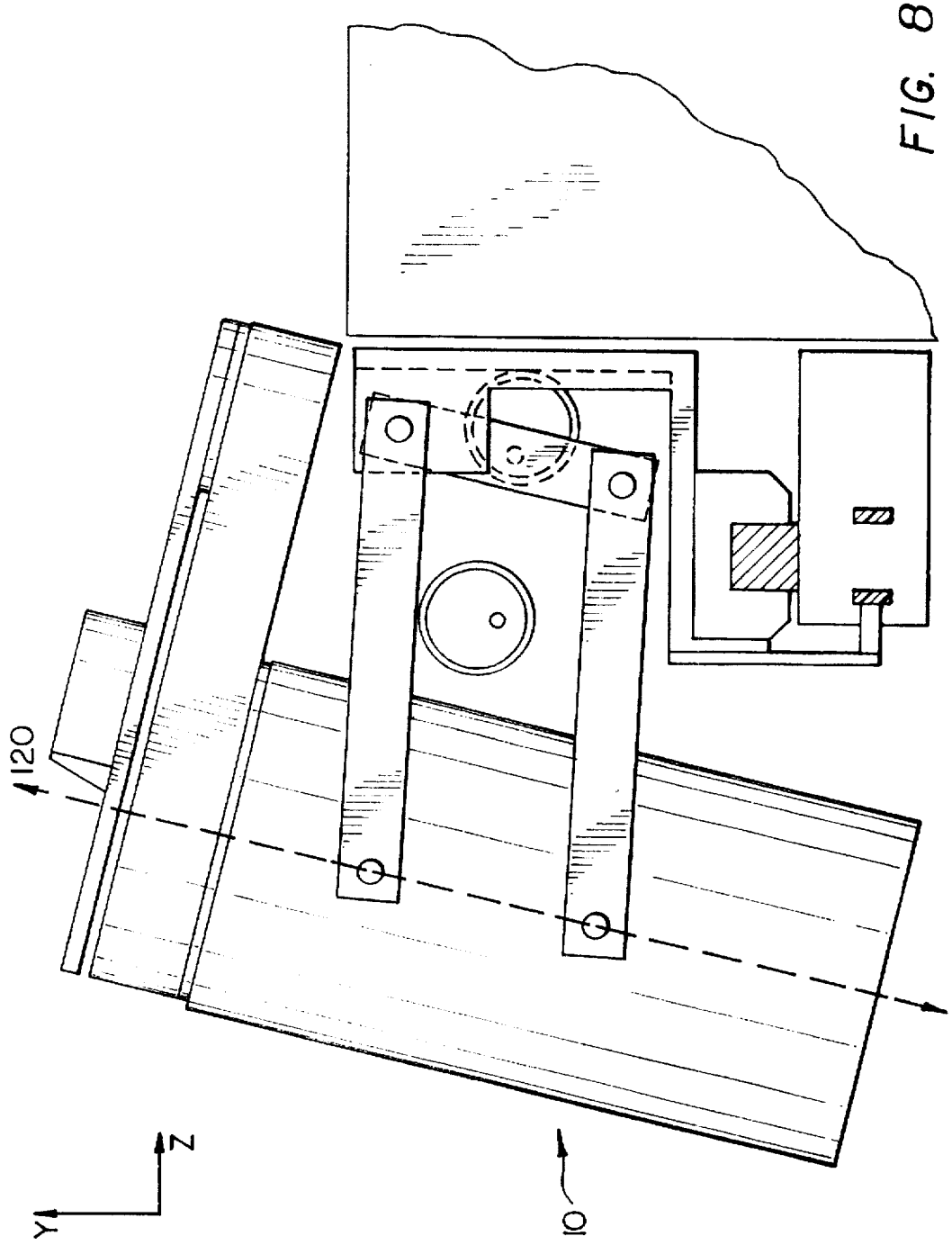

FIGS. 6–8 are side views of the robot handler illustrating lift and tilt motions in greater detail. In FIG. 6 the rotary motion assembly 10 is positioned such that the orientation axis 120 is parallel to the Y-axis. In FIG. 7 the rotary motion assembly 10 is also positioned such that the orientation axis 120 is parallel to the Y-axis, however the assembly 10 has moved along the Y-axis relative to FIG. 6. This motion is accomplished by operating the first eccentric drive mechanism. In FIG. 8 the assembly 10 is tilted in the Y-Z plane such that the orientation axis 120 is no longer parallel to the Y-axis. This motion is accomplished by operating the second eccentric drive mechanism.

The tilt capability of the pivoting four bar linkage can be used to position a substrate material on the outer rotary arm for transport. Once a wafer is collected, a vacuum is used to hold the wafer on the outer rotary arm. The arm then tilts back to a "home position," where the orientation axis is about 14° from parallel with the Y-axis. In the home position gravity can hold the wafer against the banker. The vacuum is terminated and low pressure nitrogen is exhausted from the end effectors. This allows the wafer to nestle against the banking ring mounted on the outboard rotary arm. The vacuum may be turned on again at some point to secure the wafer before deposit. In this manner the wafers can be precisely moved to and from a variety of wafer processing devices in a confined space.

Figure 9:
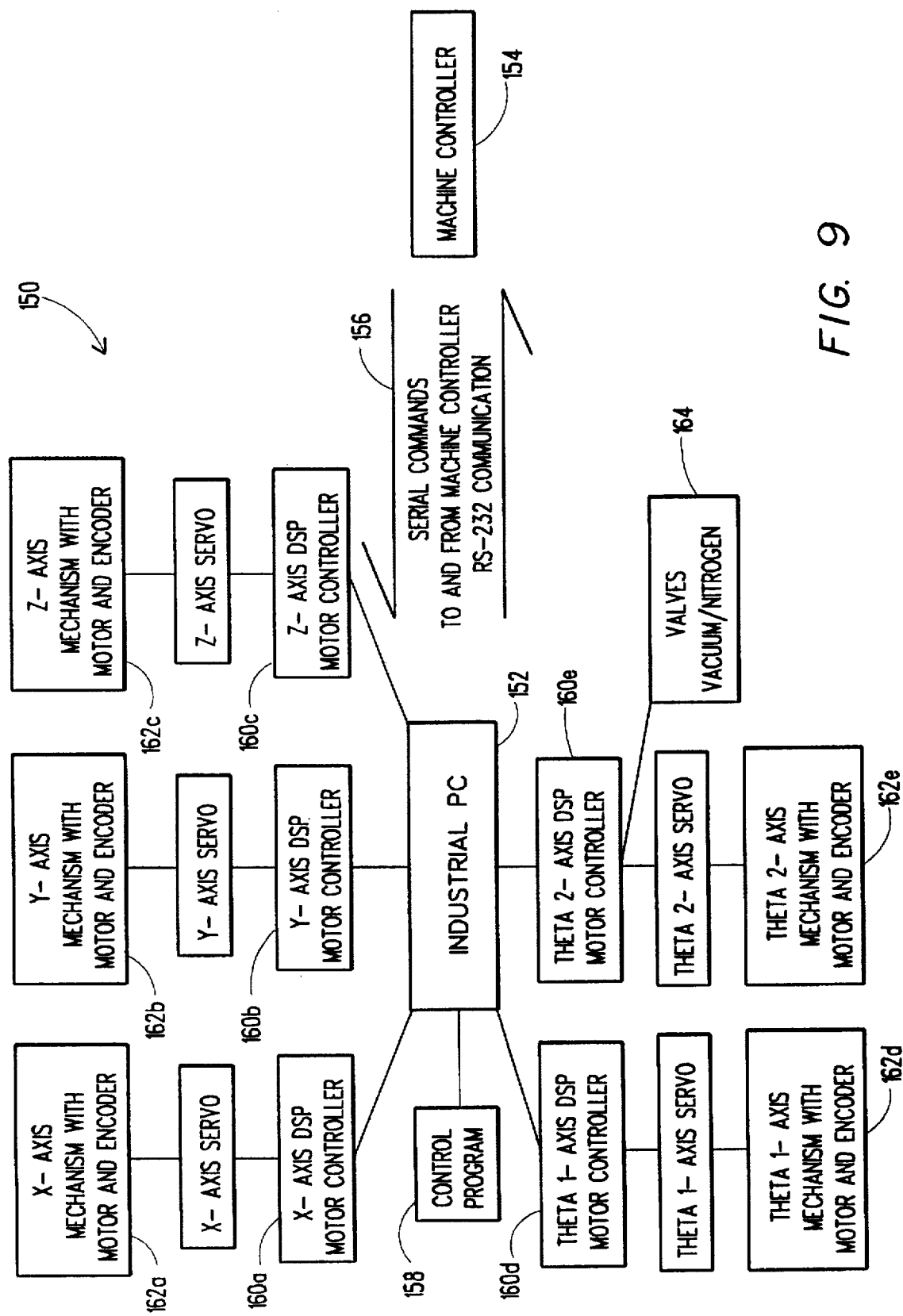
FIG. 9 is a block diagram of a motion control system for the robotic handler of FIG. 1.

FIG. 9 is a block diagram of the motion control system 150 for the robotic handler of FIG. 1. An industrial PC 152 is in communication with a machine controller 154 that sends bundled move commands 156 that are interpreted by the industrial PC. These commands typically include move sequences for multiple axis moves. The Industrial PC is running a control program 158 that then directs the movement from position to position by interpolating interim points and moving thereto. The control system includes a PC for memory and control sequences. The PC has a daughter control board that includes 5 DSP (Digital Signal Processor) motion controllers 160a, 160b, 160c, 160d, 160e. These are in 2-way communication to each of the 5 motion axis motor and encoders 162a, 162b, 162c, 162d, 162e, respectively. In this manner the motions of all axis and the valve 164 for vacuum and Nitrogen can be coordinated.

Although the invention has been shown and described with respect to exemplary embodiments thereof, various other changes, omissions and additions in form and detail thereof may be made therein without departing from the spirit and scope of the invention.

What is claimed is:

1. A robotic wafer handler comprising:
   a first drive mechanism;
   a first arm portion coupled to said first drive mechanism, and drivable by said first drive mechanism through 360 degrees of rotation;
   a second drive mechanism;
   a second arm portion coupled to said second drive mechanism, and pivotally engaged with said first arm portion, said second arm portion drivable by said second drive mechanism through more than 360 degrees of rotation with respect to said first arm portions;
   a lift mechanism coupled to said first arm portion, said lift mechanism functioning to vertically lift said first and second arm portions along a vertical axis; and
   a tilt mechanism coupled to said first arm portion, said tilt mechanism functioning to tilt said first and second arm portions.

2. The robotic wafer handler of claim 1, wherein said first and second arm portions substantially rotate in a plane.

3. The robotic wafer handler of claim 1, further including a lateral linear motion assembly coupled to said first arm portion, said lateral linear motion assembly functioning to move said first arm portion along an axis orthogonal to the vertical axis.

4. The robotic wafer handler of claim 3, wherein said second arm portion includes a laminated structure with an end effector.

5. The robotic wafer handler of claim 4, wherein said second arm portion includes holes and channels through which a gaseous material may be drawn.

6. The robotic wafer handler of claim 5, wherein said end effector includes a banker.

7. The robotic wafer handler of claim 6, wherein said first drive mechanism includes a motor coupled to said first arm portion.

8. The robotic wafer handler of claim 7, wherein said second drive mechanism includes a motor driven shaft driving a belt that rotates said second arm portion.

9. The robotic wafer handler of claim 8, wherein said lateral linear motion assembly includes a drive belt engaged with a plurality of cog pulleys.

10. The robotic wafer handler of claim 9, wherein said lift mechanism includes an eccentric drive mechanism.

11. The robotic wafer handler of claim 10, wherein said tilt mechanism includes an eccentric drive mechanism.

12. The robotic wafer handler of claim 11, further including position sensors for measuring relative positions of first and second arm portion rotation, and rotary motion assembly lift, tilt and lateral linear position.

13. The robotic wafer handler of claim 12, further including a motion control system.

14. A rotary assembly for collecting and depositing semiconductor wafers in a wafer processing system, comprising:
   a first arm portion having first and second ends;
   a second arm portion having first and second ends, said first end of said first arm portion pivotally connected to said first end of said second arm portion such that first and second arm portions are independently rotatable through more than 360 degrees of rotation, said second end of said second arm potion formed to accept wafers for transport;
   a base member coupled to said first arm portion;
   a first beam having first and second distal ends, said first beam pivotally coupled to said base member at said first end and coupled to an anchor at said second end;
   a second beam having first and second distal ends, said second beam pivotally coupled to said base member at said first end and coupled to an anchor at said second end;
   a first eccentric drive mechanism including a first asymmetrically rotatable wheel having an edge disposed against said first beam; and
   a second eccentric drive mechanism including a second asymmetrically rotatable wheel coupled to said second beam, whereby said first and second arm portions may be lifted, tilted, and simultaneously lifted and tilted through rotation of said first and second asymmetrically rotatable wheels.

15. The robotic wafer handler of claim 14, including a first rotational drive mechanism with a motor coupled to said first arm portion, said first rotational drive mechanism operative to rotate said first arm portion with respect to said second arm portion.

16. The robotic wafer handler of claim 15, including a second rotational drive mechanism with a motor driven shaft which drives a belt that is coupled to and rotates said second arm portion.

17. The robotic wafer handler of claim 16, further including an encoder disposed proximate to, and operationally engaged with said motor driven shaft.

18. A method of transporting wafers from a starting point to a destination point in a wafer fabrication system by employing a robot having first and second linked arm portions, comprising the steps of:

positioning the second arm portion below a wafer at the starting point;

securing the wafer to the second arm portion by applying a vacuum through the second arm portion;

tilting the second arm portion away from the starting point;

rotating said first arm portion with respect to said second arm portion pivotally connected to said first arm portion; and rotating said second arm portion with respect to said first arm portion.

19. The method of claim 18, further including moving said first and second arm portions laterally.

20. The method of claim 19, further including lifting said first and second arm portions.

* * * * *